United States Patent [19]
Satoh

[11] Patent Number: 6,102,273
[45] Date of Patent: Aug. 15, 2000

[54] DIE BONDING APPARATUS

[75] Inventor: Ryoko Satoh, Yamagata, Japan

[73] Assignee: NEC Corporation, Tokyo, Japan

[21] Appl. No.: 09/120,314

[22] Filed: Jul. 22, 1998

[30] Foreign Application Priority Data

Jul. 22, 1997 [JP] Japan .................................. 9-195772

[51] Int. Cl.⁷ .............................. B23K 1/00; B23K 5/00; B23K 20/14
[52] U.S. Cl. ............................... 228/42; 228/102; 228/6.2
[58] Field of Search .............................. 228/102, 6.2, 42; 29/25.01

[56] References Cited

U.S. PATENT DOCUMENTS

| | | | |
|---|---|---|---|
| 4,974,754 | 12/1990 | Wirz ........................................ | 222/207 |
| 4,984,731 | 1/1991 | Imamura ................................. | 228/102 |
| 4,987,673 | 1/1991 | Kogura et al. ............................ | 29/564 |
| 5,115,545 | 5/1992 | Fujimoto et al. ........................ | 29/25.01 |
| 5,232,143 | 8/1993 | Buxton ..................................... | 228/6.2 |
| 5,749,510 | 5/1998 | Eifuku ..................................... | 228/122.1 |
| 5,899,341 | 5/1999 | Irita ......................................... | 209/571 |

FOREIGN PATENT DOCUMENTS 6-29331   2/1994   Japan .

*Primary Examiner*—Patrick Ryan
*Assistant Examiner*—C. Newsome
*Attorney, Agent, or Firm*—Young & Thompson

[57] ABSTRACT

In a die bonding apparatus, above a work placing table shrouded in the atmosphere of an inert gas, there are provided a pair of gas injecting heads which can be separated from each other to enlarge the opening to the degree that the largest semiconductor package can be inserted through the opening and which can reduce the opening to the degree that a bonding head can be inserted through the opening. The pair of gas injecting heads form at least two layers of gas curtain by injecting an inert gas from the inner wall of the opening, so that the inert gas atmosphere is ensured within a space, so as to maintain the oxygen concentration at a low level thereby to prevent generation of an oxide film. Thus, the oxide film is prevented from generating at a surface of a bonding agent when the bonding agent is molten at the time of a die bonding.

6 Claims, 7 Drawing Sheets

DIE BONDING APPARATUS

BACKGROUND OF THE INVENTION

1. Field of the Invention

The present invention relates to a die bonding apparatus for bonding a semiconductor pellet to a semiconductor device package such as a stem or a lead frame by using a hard solder such as AuSn, AuGe and AuSb as a bonding agent.

2. Description of Related Art

In the prior art, in case of a semiconductor device such as a microwave semiconductor device having electric characteristics susceptible to influence of heat, a hard solder such as AuSn, AuGe and AuSb having a good heat conductivity has been used for bonding a semiconductor pellet. However, when die bonding is carried out by using this kind of bonding agent, an oxide film can be formed on a surface of a molten bonding agent by oxidation in the open air, so that a void is generated a: a boundary between this oxide film and the semiconductor pellet, with the result that a sufficient bonding strength cannot be obtained.

Ordinarily, the bonding is carried out in an inert gas atmosphere covered with an atmosphere cover, so as to prevent oxidation. Furthermore, even if a thin oxide film is generated, the semiconductor pellet is pressed down by a pincette so that a scribing operation is used to remove the thin oxide film before the bonding. However, even if the scribing operation is carried out in the inert gas atmosphere, oxygen is present in the open air, so that oxidation occurs. Because of this, the formed oxide film cannot be completely removed with only the scribing operation, with the result that voids occur in the oxide film remaining at the boundary between the bonding agent and the semiconductor pellet or the stem. As a result, there was a problem that heat resistance becomes large, so that a desired characteristic cannot be obtained or the semiconductor pellet is destroyed because of an elevated temperature.

FIG. 5 is a front view illustrating one example of the prior art die bonding apparatus, which is disclosed in Japanese Patent Application Pre-examination Publication No. JP-A-06-029331 as a die bonding apparatus in order to overcome the above mentioned problem. As shown in FIG. 5, this die bonding apparatus includes a work placing table 29 having a heating mechanism for placing thereon a semiconductor device package 33 which is the stem, a solder supplying mechanism 32 for cutting a bonding agent 34 into an arbitrary size and for supplying and locating the arbitrary size of bonding agent on an upper surface of the semiconductor device package 33, and a die bonding head 28 for locating a semiconductor device 35 on the bonding agent 34 placed on the semiconductor device package 33 so as to carry out a die bonding.

A periphery of the work placing table 29 is surrounded by an atmosphere cover 30 of a triple cover structure, and an inert gas is supplied between each pair of adjacent atmosphere covers 30, so that gas layers having different pressures are generated. Each of inert gas flow rate setters 31 sets the flow rate of the inert gas which is supplied through a pipe to between each pair of adjacent atmosphere covers 30, so that pressure differences are generated among the inert gas layers.

Now, an operation of this die bonding apparatus will be described. First, the bonding agent 34 is supplied on the upper surface of the stem of the semiconductor device package 33 which is heated on the work placing table 29, by means of the solder supplying mechanism 32. The bonding agent 34 is molten by the heating of the work placing table 29. Then, the semiconductor device 35 is placed on the molten bonding agent 34 by means of the die bonding head 28.

At this time, when a first layer of inert gas is injected from an opening of an innermost atmosphere cover 30, the first layer of inert gas is prevented from catching the air by a second layer of inert gas. Furthermore, when a nozzle of the solder supplying mechanism 32 and a nozzle of the die bonding head 28 are inserted into the opening, these nozzles are prevented from destroying the inert atmosphere by having air therein, by action of a third layer of inert gas which prevents intrusion of air.

As mentioned above, since the three inert gas layers having different gas pressures are formed at the opening of the atmosphere cover 30, the open air is excluded from being in the inside of the atmosphere cover, so that generation of the oxide film is prevented when the bonding agent 34 is in a molten condition.

In the above mentioned prior art die bonding apparatus, for the scribing operation of the semiconductor pellet by the pincette and for positioning of the stem on the work placing table, the opening of the fixed atmosphere cover has to be larger than the size of the stem by a degree large enough to enable to insertion not only the stem but also the pincette through the opening. However, if the opening, which is determined by the size of the stem constituting the semiconductor device package, becomes too large, it becomes impossible to prevent the entry of air even if the conditions of the pressures and the flow rates of the three layers of inert gas are changed. As a result, there occurs a problem that the oxidation of the bonding agent cannot be avoided and therefore the voids are generated.

Furthermore, in connection with the above mentioned problem, this type of semiconductor device package includes various sizes from a large size to a small size. Therefore, the above mentioned prior art apparatus is required to previously prepare a number of atmosphere covers having different sizes of opening which meet with different sizes of semiconductor device packages, respectively. This means that when the kind of the product is changed, the atmosphere cover must be exchanged and adjusted. Therefore, a considerable time is expended, so that productivity becomes low.

In addition, since this die bonding apparatus was mainly adapted to a small size of semiconductor package, the semiconductor device package could be heated to a predetermined temperature for a relatively short time by the heat from the work placing table, only by placing the semiconductor device package on the work placing table. However, if the stem which is the semiconductor device package becomes large, not only the volume becomes large, but also a gap occurs at a contacting plane between the semiconductor device package and the work placing table, so that a sufficient heat conduction cannot be obtained, with the result that there occurs a problem that a considerable heating time becomes necessary. In addition, necessity of the considerable heating time results in acceleration of the oxidation of the bonding agent, so that the above mentioned problem of voids occur more and more.

SUMMARY OF THE INVENTION

Accordingly, it is an object of the present invention to provide a die bonding apparatus which can reduce the oxygen concentration of a space shrouding therein the semiconductor pellet, the bonding agent and the semiconductor device package, thereby to prevent the oxidation of the bonding agent, and which has a high degree of generality in use so that it can be used regardless of the outer size and the shape of the semiconductor device package.

According to the present invention, there is provided a die bonding apparatus which includes a work placing table for placing thereon a semiconductor device package, a solder supplying mechanism for supplying and locating a bonding agent piece on the semiconductor device package, and a bonding head for locating a semiconductor pellet on the bonding agent piece, the die bonding apparatus comprising a pair of gas injecting heads located to be higher than the semiconductor pellet placed on the work placing table, the gas injecting heads being able to be separated from each other and to be abutted against each other so as to form an opening of the since allowing insertion of the solder supplying mechanism or the bonding head, the gas injecting heads having at least two vertically separated arrays of gas nozzles formed at an inner circumferential wall surface of the opening, means for introducing an inert gas into a closed space between the pair of gas injecting heads and the work placing table, a hold-down member for holding down the semiconductor device package on the work placing table, and a shutter mechanism for causing the pair of gas injecting heads to separate from each other and to abut against each other.

In addition, the shape of the opening is preferred to be similar to the contour of the solder supplying mechanism or the die bonding head. Furthermore, it is preferred to mount the hold-down member on each of the pair of gas injecting heads, and to provide an up-down mechanism for vertically moving the pair of gas injecting heads. Preferably, the shutter mechanism and the up-down mechanism for the pair of gas injecting heads are driven in coordination with each other by one power source.

DESCRIPTION OF THE PREFERRED EMBODIMENTS

Figure 1A:
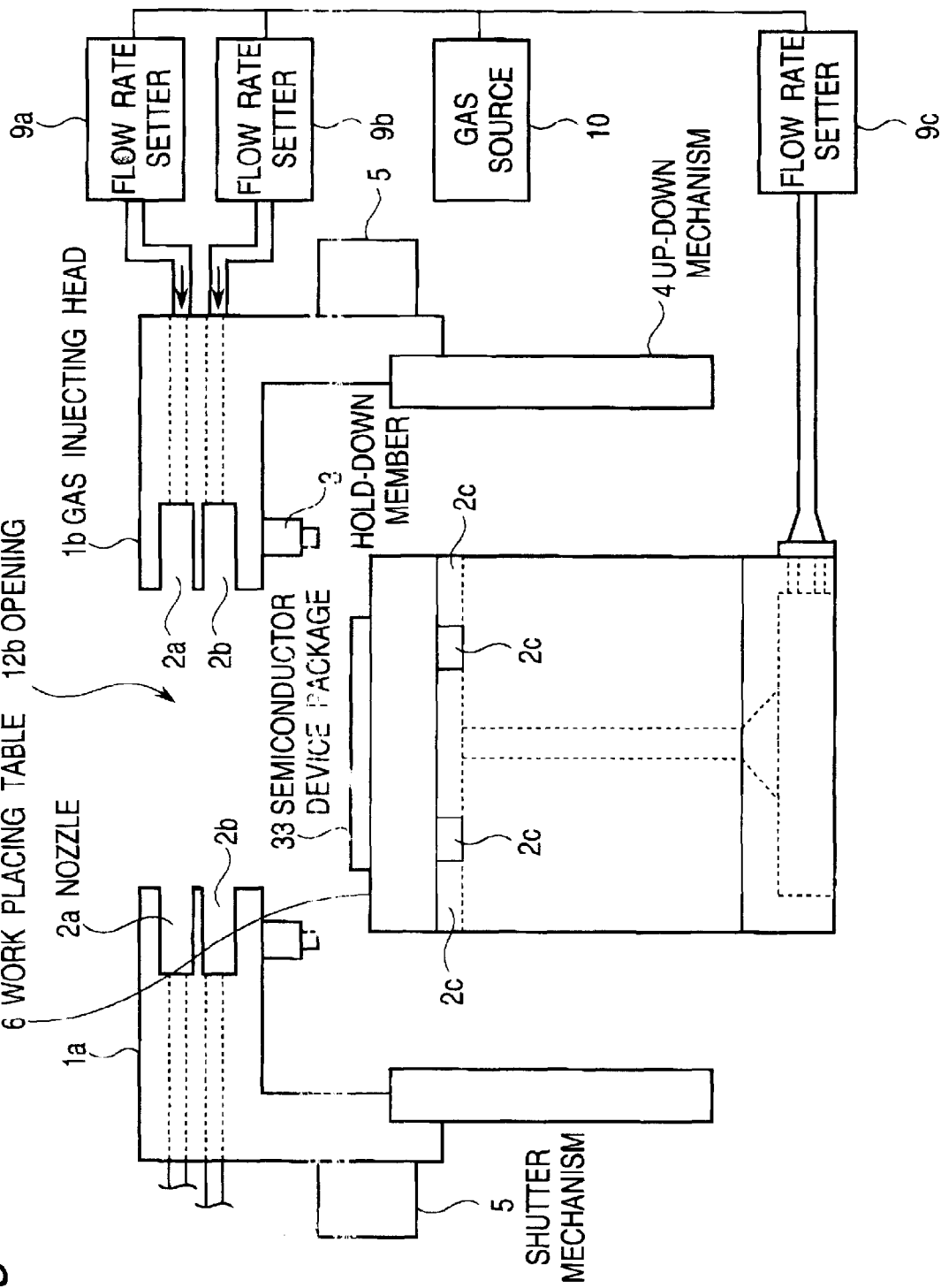
FIGS. 1A and 1B are front views of one embodiment of the die bonding apparatus in accordance with the present invention.
Figure 1B:
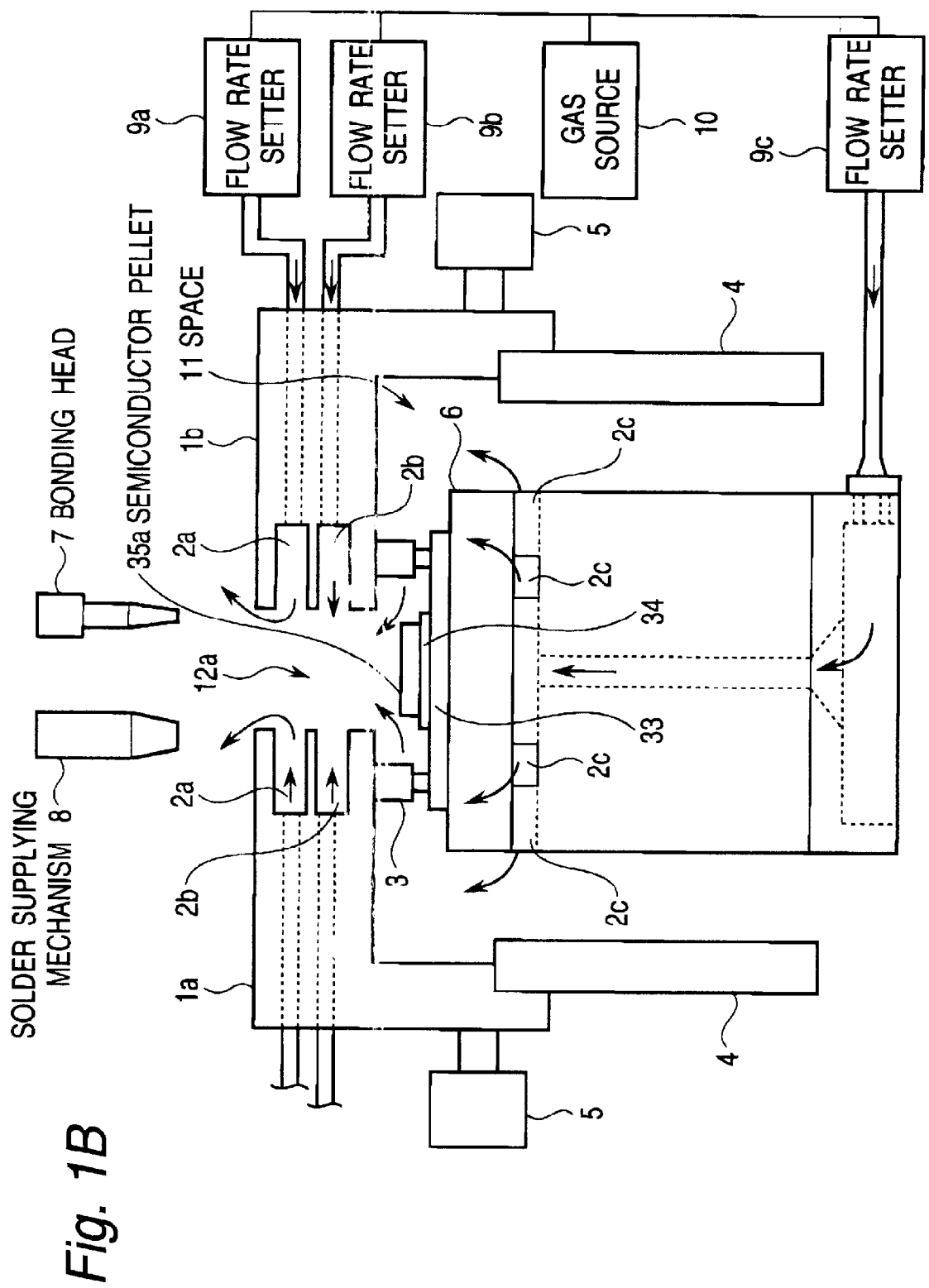

Now, the present invention will be described with reference to the drawings. FIGS. 1A and 1B are front views of one embodiment of the die bonding apparatus in accordance with the present invention, and FIG. 2 is a plan view of the gas injecting heads shown in FIGS. 1A and 1B in a closed condition.

As shown in FIGS. 1A and 1B, the die bonding apparatus comprises a work placing table 6 for placing thereon an assembly constituted by stacking a semiconductor package 33, a bonding agent 34 and a semiconductor pellet 35a. The work placing table 6 includes a plurality of nozzles 2c for injecting an inert gas into a space 11 in which the assembly is placed. The die bonding apparatus also comprises a pair of gas injecting heads 1a and 1b configured to be separated from each other and having an opening 12a when the pair of gas injecting heads are abutted against each other, the opening 12a having the size allowing a bonding head 7 and a solder supplying mechanism 8 to be inserted into the opening 12a with a gap. The pair of gas injecting heads 1a and 1b have a plurality of gas nozzles 2a and 2b formed at an inner wall of the opening 12a along an inner circumference to form two vertically separated arrays of nozzles. The die bonding apparatus further comprises an up-down mechanism 4 for lowering the gas injecting heads 1a and 1b to cause hold-down members 3 to hold down the semiconductor device package 33 placed on the work placing table 6, and a shutter mechanism 5 for moving the pair of gas injecting heads 1a and 1b toward each other so as to abut an abutting portion of the gas injecting heads against each other, and for separating the pair of gas injecting heads 1a and 1b from each other.

Moreover, this die banding apparatus includes a gas source 10 for supplying an inert gas to the gas nozzles 2a, 2b and 2c, and flow rate setters 9a, 9b and 9c for setting the flow rate of the inert gases supplied to the gas nozzles 2a, 2b and 2c, respectively.

Figure 2:
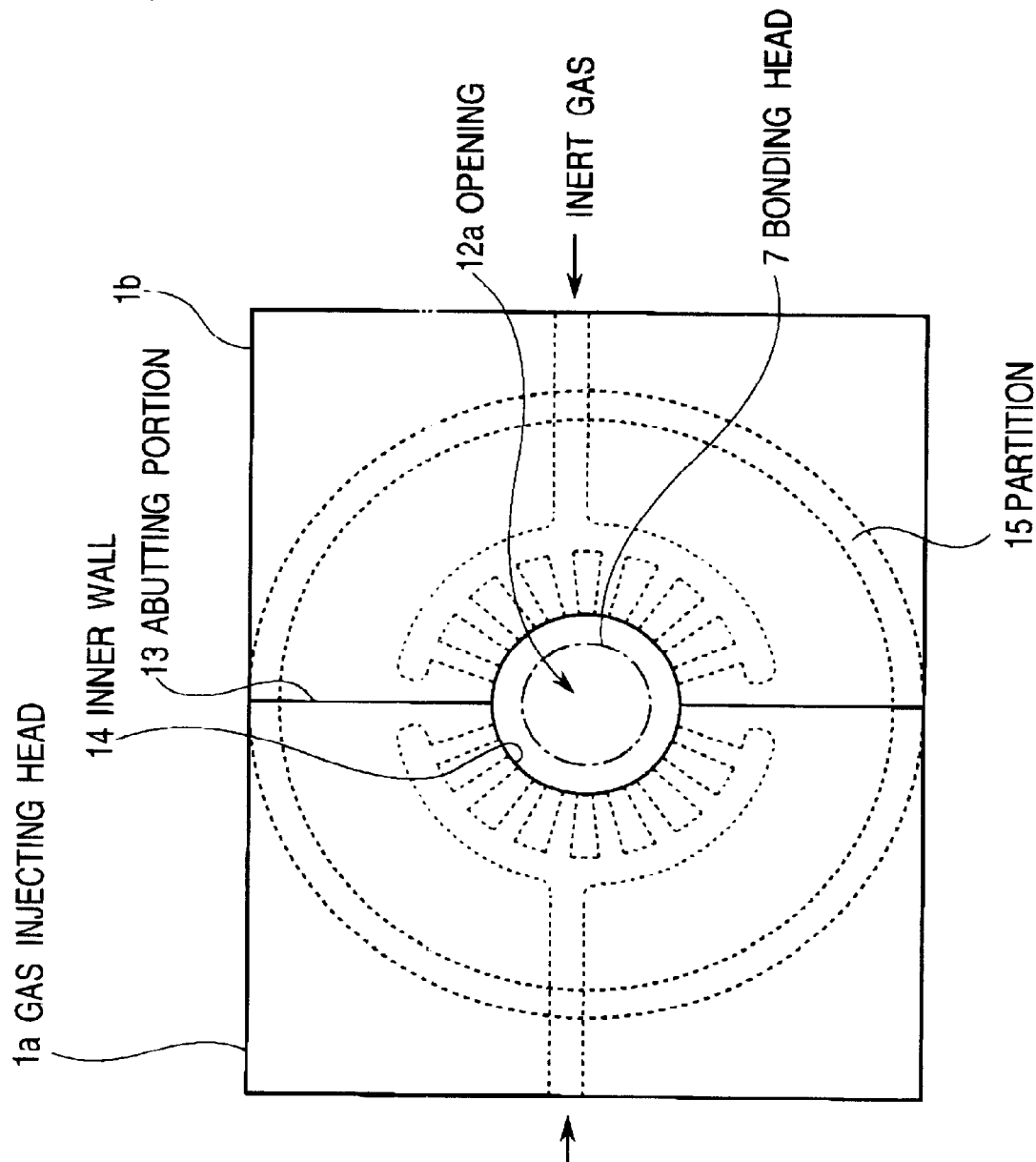
FIG. 2 is a plan view of the gas injecting heads shown in FIGS. 1A and 1B in a closed condition.

Incidentally, as shown in FIG. 2, the pair of gas injecting heads 1a and 1b closed by the shutter mechanism 5 of FIGS. 1A and 1B are brought into contact with each other at the abutting portions 13, so as to form an opening 12a which is confined by an inner wall 14 having the shape similar to a contour of the bonding head 7 to be inserted. This opening 12a is slightly larger than the contour of the bonding head 7, so that the bonding head 7 can be automatically inserted with a gap of for example 1 mm, without interfering with another member.

Furthermore, in FIG. 2, the opening 12a is circular, but if the sectional shape of the bonding head 7 is square, the opening 12a is made square. Of course, if the solder supplying mechanism 8 is larger than the bonding head 7, the shape and the size of the opening 12a is adapted to the shape and the size of the solder supplying mechanism 8. The gas nozzles 2a and 2b for injecting the inert gas from the inner wall 14 are preferably formed along the inner circumference of the inner wall 14 with equal intervals. The inert gas from the gas nozzles 2c in the work placing table 6 in FIGS. 1A and 1B is supplied into the space 11 confined by the closed gas injecting heads 1a and 1b and a partition 15 extending downward from the gas injecting heads 1a and 1b.

Now, an operation of this die bonding apparatus will be described with reference to FIGS. 1A and 1B and FIG. 2. First, as shown in FIG. 1A, the gas injecting heads 1a and 1b are opened by action of the shutter mechanism 5 so that a large opening 12b is formed. The semiconductor device package 33 is inserted through the large opening 12b and is placed on the work placing table 6. If the semiconductor device package 33 is placed on the work placing table 6, the opened gas injecting heads 1a and 1b are closed by action of title shutter mechanism 5 so that a small opening 12a is formed. Furthermore, the gas injecting heads 1a and 1b are lowered by the up-down mechanism 4 so that the hold-down members 3 hold down the semiconductor device package 33 on the work placing table 6.

Next, while for example nitrogen, which is the inert gas, is injected from the gas nozzles 2a, 2b and 2c, a bonding agent piece 34 obtained by cutting a reeled bonding agent into an arbitrary length, is sucked by a not-shown sucking mechanism of the solder supplying mechanism 8, and is inserted through the opening 12a and then placed by means of the solder supplying mechanism 8 on an upper surface of the semiconductor device package 33 heated on the work placing table 6 at a temperature of for example 320° C. The cut piece of bonding agent 34 is heated and molten.

Further, the semiconductor pellet 35a is sucked by a sucking mechanism of the die bonding head 7, and the die bonding head 7 is inserted through the opening 12a, and then, the semiconductor pellet 35a is transferred and pushed onto the molten bonding agent 34. Thus, the mounting of the semiconductor pellet 35a is completed. In this operation, a first layer of inert gas injected from the nozzles 2c is prevented from flowing out from the opening 12a of the gas injecting heads 1a and 1b, by action of a gas curtain formed of a second layer of inert gas injected from the nozzles 2b. In addition, when the solder supplying mechanism 8 and the die bonding head 7 are inserted through the opening 12a, respectively, the being air is prevented from entering involved by a third layer of inert gas injected from the nozzles 2a of the gas injecting heads 1a and 1b. Of course, the larger the number of the gas curtain layers is, it is possible to maintain the inert gas atmosphere in an inner closed space at a high degree of purity. However, for simplification of the structure, the three layer structure is suitable.

The flow rate of the inert gas supplied to the respective nozzles 2a, 2b and 2c through a pipe from the gas source 10 is previously set by the flow rate setters 9a, 9b and 9c. These flow rates are preferably set in such a manner that the flow rate of the nozzles 2c is set to maintain the oxygen amount at a level not greater than a maximum permissible value, and considering the flow rate of the nozzles 2c as a reference flow rate, the flow rate of the nozzles 2b is smaller than the reference flow rate and the flow rate of the nozzles 2a is further smaller, so that the total consumed amount of the inert gas is reduced.

For example, assuring that nitrogen is used as the inert gas, it is preferred that the ratio of the first layer of the space 11 to the second layer of the nozzles 2b to the third layer of the nozzles 2a is 10:1:1, although the flow rate of nitrogen changes dependently upon the size and the shape of the space 11. In order to obtain a satisfactory inert gas atmosphere in the space 11 which is the first layer of inert gas (oxygen concentration of not greater than 40 ppm), a gap from the upper surface of the semiconductor device package 35a to a tower surface of the gas injecting heads 1a and 1b is required to be two time the gap between the other layers of inert gas.

Figure 3A:
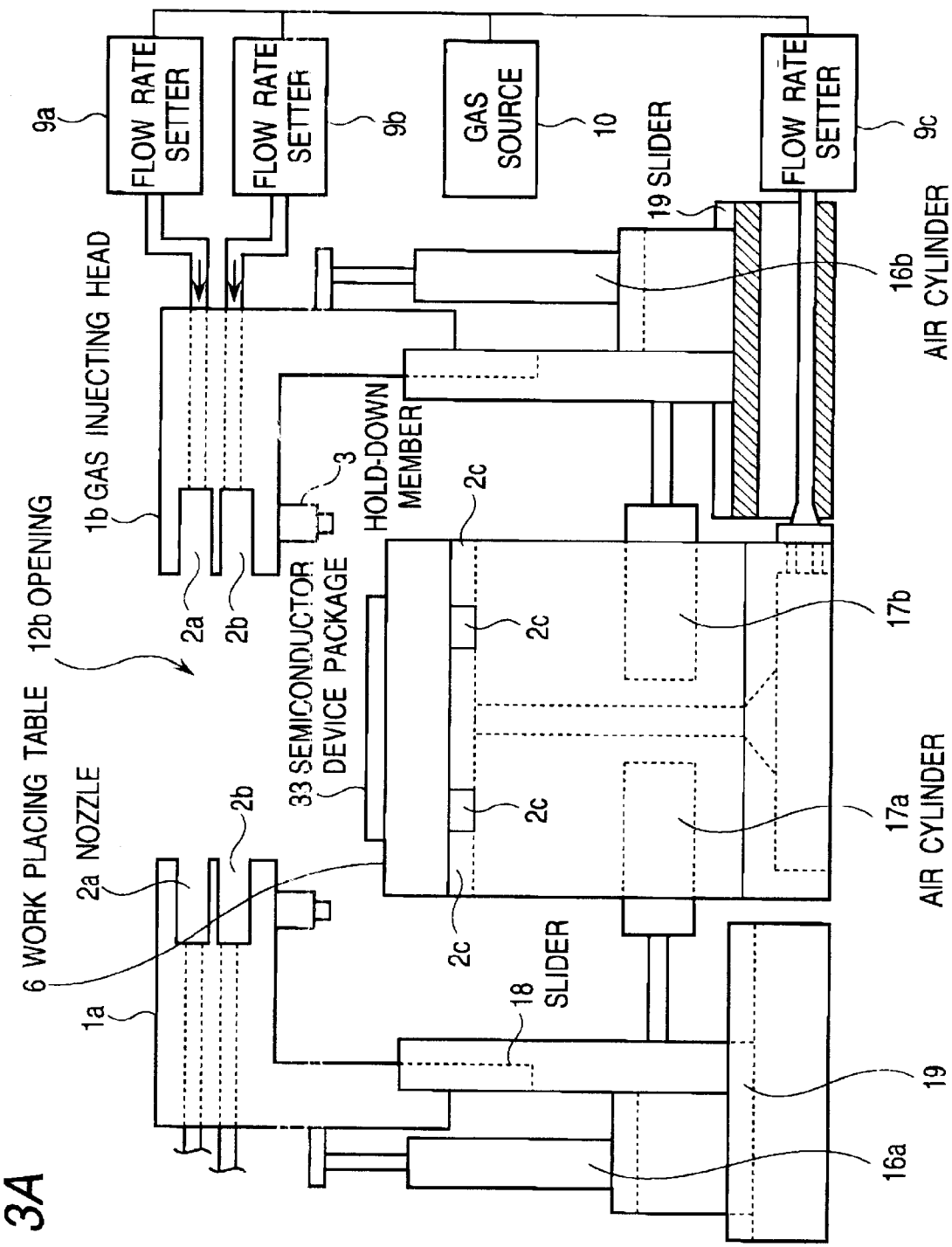
FIGS. 3A and 3B are views for illustrating one example of the up-down mechanism and the shutter mechanism shown in FIGS. 1A and 1B.
Figure 3B:
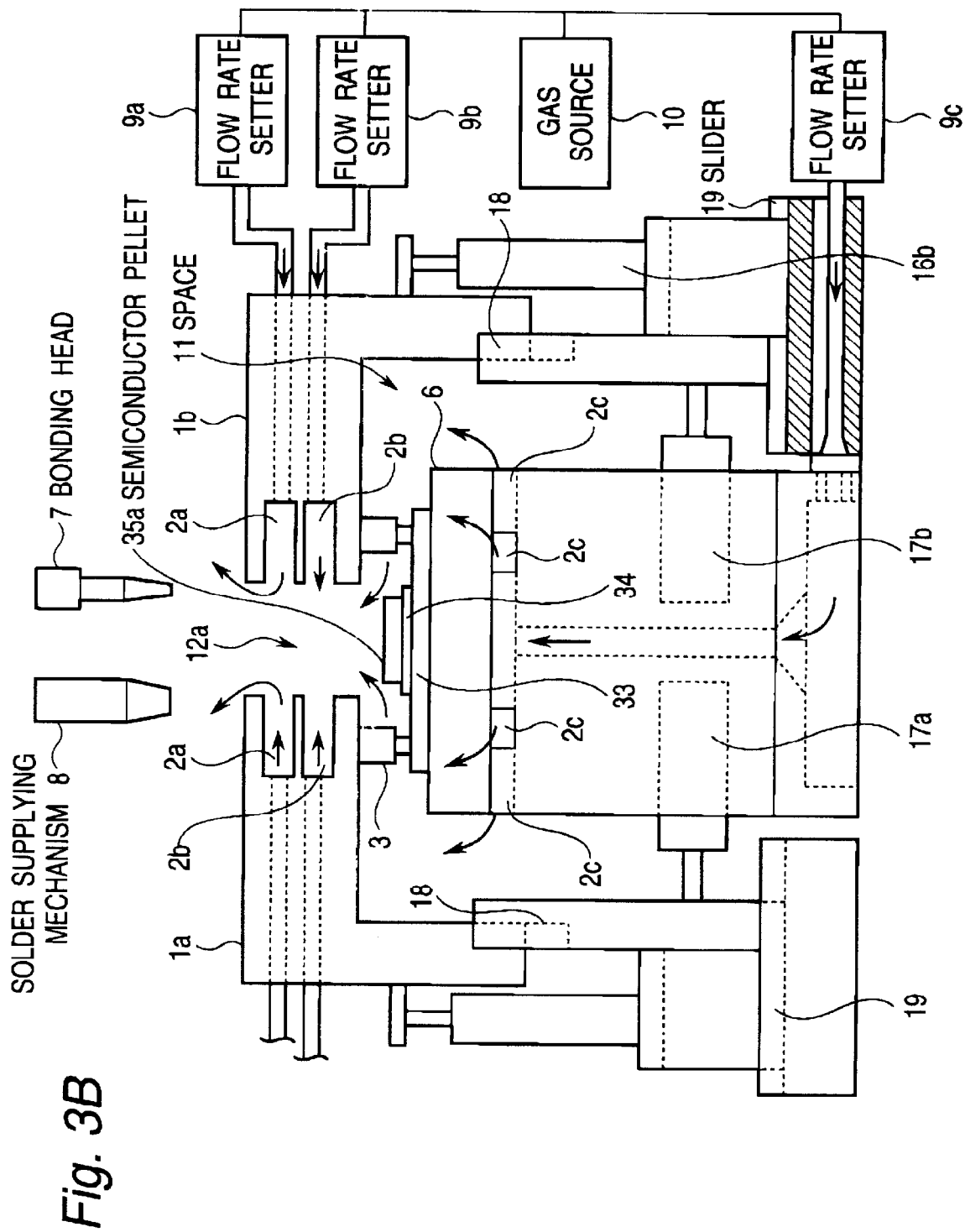

FIGS. 3A and 3B are views for illustrating one example of the up-down mechanism and the shutter mechanism shown in FIGS. 1A and 1B. The up-down mechanism in the above mentioned die bonding apparatus comprises air cylinder mechanisms 16a and 16b for vertically driving the gas injecting heads 1a and 1b, respectively, and members having a slider 18 along which the gas injecting heads 1a and 1b slide vertically, as shown in FIGS. 3A and 3B.

Furthermore, the shutter mechanism for opening and closing the gas injecting heads 1a and 1b comprises air cylinder mechanisms 17a and 17b for driving assemblies including the gas injecting heads 1a and 1b and the up-down mechanisms, respectively, to approach to each other and to separate from each other, and bases having a slider 19 for straightly and slidably guiding these assemblies, respectively. These mechanisms are simple in structure and inexpensive, since it is possible to utilize, without modification, a commercially available sequencer for controlling valves for operating the air cylinder mechanisms 16a and 16b and 17a and 17b.

Figure 4:
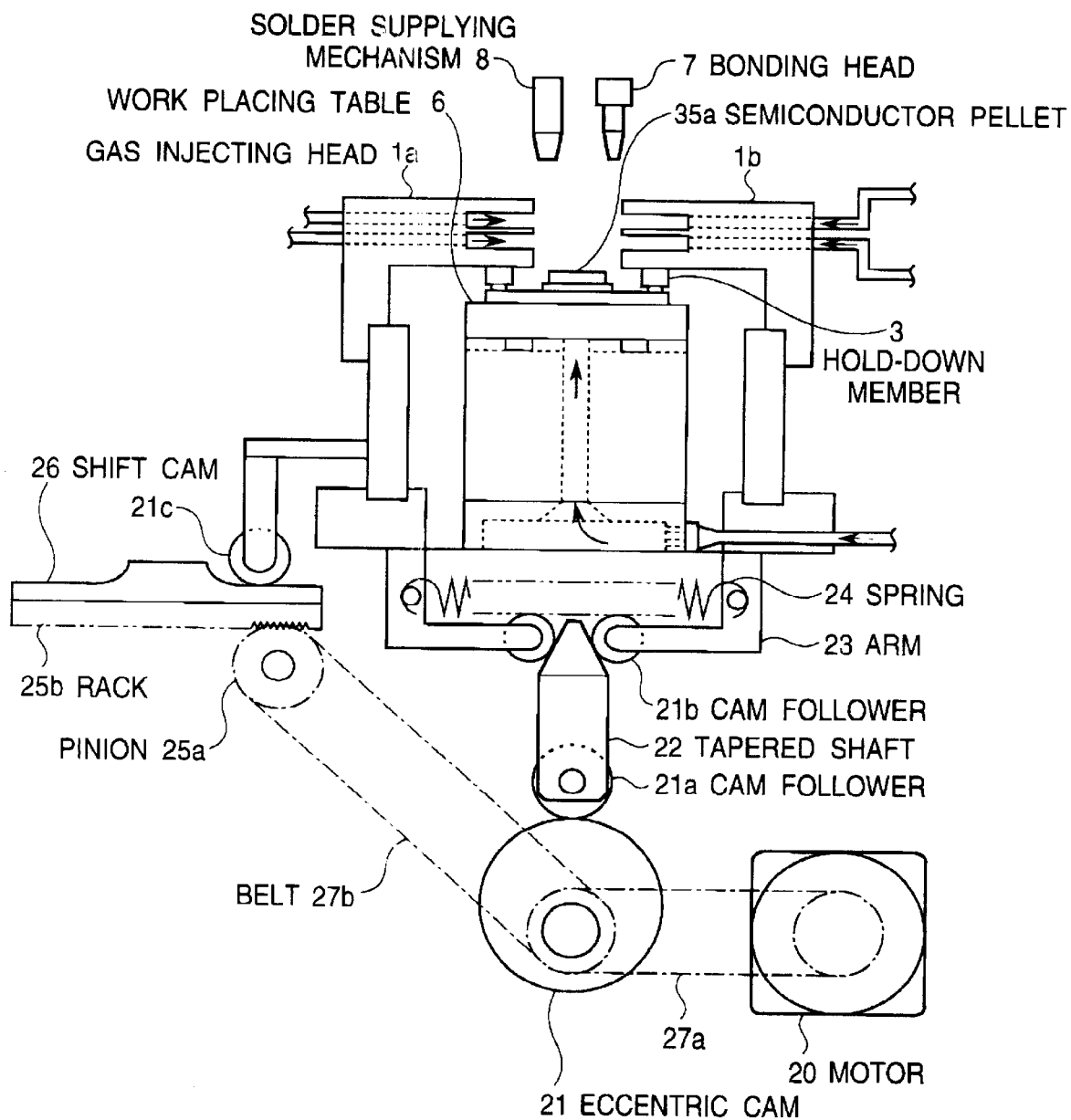
FIG. 4 is a view for illustrating another example of the up-down mechanism and the shutter mechanism shown in FIGS. 1A and 1B.
Figure 5:
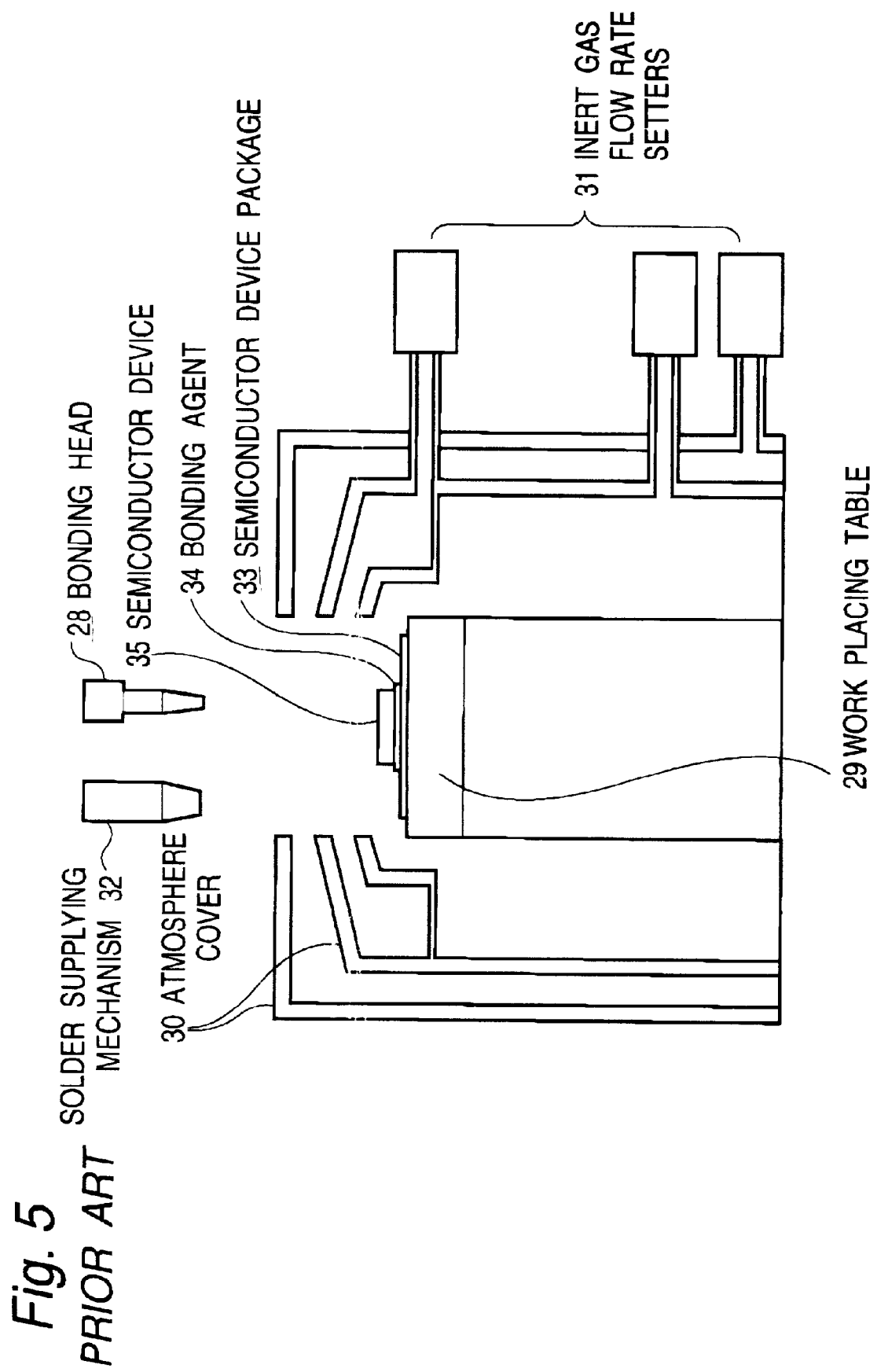
FIG. 5 is a front view illustrating one example of the prior art die bonding apparatus.

FIG. 4 is a view for illustrating another example of the up-down mechanism and the shutter mechanism shown in FIGS. 1A and 1B. The shown up-down mechanism and shutter mechanism are constructed to interlock, or coordinate the up-down operation and the open/close operation of the gas injecting heads 1a and 1b, on the basis of a rotation of a motor which is one driving source, and by using machine elements such as cams and gears.

Namely, the shutter mechanism includes an eccentric cam 21 rotationally driven through a belt 27a by the rotation of the motor 20, a tapered shaft 22 vertically (displaced by a cam follower 21a with a change in height generated by the rotation of the eccentric cam 21, and cam follower 21b mounted on a leg of the gas injecting heads 1a and 1b, respectively, and biased by a counter force of a spring 24 so as to be abutted against a tapered surface of the tapered shaft 22.

On the other hand, the up-down mechanism includes a pinion 25a rotationally driven through a belt 27b and a pulley mounted on a rotating shaft of the eccentric cam 21 rotated by the same motor 20, a rack 25b mating with the pinion 25a, a shift cam 26 mounted on a rear surface of the rack 25b, and a cam follower 21c in contact with the shift cam 26 moved by the rack 25b and the pinion 25a, for vertically displacing the gas injecting heads 1a and 1b.

Now, an operation of the up-down mechanism and the shutter mechanism will be described. If the motor 20 is rotated so that the eccentric cam 21 is rotated, the tapered shaft 22 is elevated with the rotation of the eccentric cam. The cam followers 21b in contact with the tapered surface of the tapered shaft 22 are moved to separate from each other against the counter force of the spring 24, with the result that the gas injecting heads 1a and 1b starts to open. When the lift amount of the rotating eccentric cam 21 reaches a maximum the cam followers 21b mounted on an arm 23 of the leg of the gas injecting heads 1a and 1b are separated from each other to a maximum extent, so that the gas injecting heads 1a and 1b are separated from each other to a maximum extent. In this condition, it becomes possible to place the semiconductor device package 35a on the work-placing table 6.

On the other hand, the pinion 25a rotating in synchronism with the eccentric cam 21 displaces the rack 25b rightward in the drawing by the rotation of the pinion itself, so that the cam follower 21c in contact with the shift cam 26 mounted on the rear surface of the rack 25b displaces in a condition that the shift amount of the cam follower 21c on the shift cam 26 is zero, until the gas injecting heads 1a and 1b starts to open, and then, the cam follower 21c mounted on the gas injecting head 1a rides on a projected portion of the shift cam 26 by a further rotation of the eccentric cam 21 and the pinion 25a, with the result that the gas injecting head 1a is lifted up. While the cam follower 21c moves on a flat portion of the shift cam 26, the gas injecting heads 1a and 1b stay at a constant position. Namely, the gas injecting heads 1a and 1b are at the highest position.

Furthermore, the lift amount of the eccentric cam 21 becomes gradually small with a still further rotation of the motor 20, and therefore, the tapered shaft 22 lowers, so that the cam followers 21b approach each other and the gas injecting heads 1a and 1b start to close. On the other hand, since the cam follower 21c still rides on the flat portion of the shift cam 26, the gas injecting heads 1a and 1b are maintained at the elevated position.

Then, the tapered shift 22 completely lowers with a further rotation of the eccentric cam 21, so that the gas injecting heads 1a and 1b are closed, and therefore, the opening becomes a minimum. On the other hand, the cam follower 21c descends from the projected portion with the displacement of the shift cam 26, so that the gas injecting heads 1a and 1b lowers and the hold-down members 3 hold down the semiconductor device package 35a.

As mentioned above, since the up-down mechanism and the shutter mechanism can be interlocked with each other while optimizing the timing, by using one motor as a driving source and by utilizing machine elements including the gears and the cams in a power transmission mechanism, it is advantageous that the electromagnetic values and the sequencers for operating the air cylinder mechanisms and extra power sources are no longer necessary. Furthermore, high reliability can be advantageously obtained since there is neither a poor operation of the mechanism caused by a malfunction of the electromagnetic valves for the air cylinder mechanisms used in the first embodiment, nor trouble with parts destruction caused by a mechanical shock due to the air cylinder mechanisms.

As mentioned above, the present invention is characterized in that above the work placing table shrouded in the atmosphere of the inert gas, there are provided a pair of gas injecting heads which can be separated to enlarge the opening to the degree that the largest semiconductor package can be inserted through the opening and which can reduce the opening to the degree that the bonding head can be inserted through the opening, the pair of gas injecting heads forming at least two layers of gas curtain by injecting an inert gas from the inner wall of the opening. With this arrangement, the present invention can be applied to various shapes and various outer sizes of semiconductor device packages, and can carry out a bonding between the semiconductor pellet and the semiconductor device package in the atmosphere having a small oxygen content. Therefore, the degree of generality in use can be elevated, and also, it becomes unnecessary to arrange the order of operations and to exchange the parts of the apparatus on the basis of differences in the semiconductor packages. Accordingly, it is advantageous that the running cost of the apparatus can be reduced, and the operating efficiency of the apparatus can be elevated.

Furthermore, since it is possible to carry out the bonding in the inert gas atmosphere having a small oxygen content, and which is partitioned by at least two layers of gas curtains to prevent entry of air, no oxide film is generated at a boundary between the bonding agent and the semiconductor device package and the semiconductor pellet, and void generation in the oxide film becomes zero. Therefore, it is advantageous that the yield of production, is elevated, and reliability of the semiconductor device is also elevated. In addition, by providing the member for holding down the semiconductor device package on the work placing table, the heat conducting efficiency becomes good, so that even if the kind of the product is changed, the heating time becomes substantially a constant, and therefore, the production efficiency is advantageously elevated.

What is claimed is:

1. A die bonding apparatus which includes a work placing table for placing thereon a semiconductor device package, a solder supplying mechanism for supplying and locating a bonding agent piece on said semiconductor device package, and a bonding head for locating a semiconductor pellet on said bonding agent piece, the die bonding apparatus comprising a pair of gas injecting heads located to be higher than said semiconductor pellet placed on said work placing table, said gas injecting heads being able to be separated from each other and to be abutted against each other so as to form an opening of the size allowing insertion of said solder supplying mechanism or said bonding head, said gas injecting heads having at least two vertically separated arrays of gas nozzles formed at an inner circumferential wall surface of said opening, means for introducing an inert gas into a closed space between said pair of gas injecting heads and said work placing table, a hold-down member for holding down said semiconductor device package on said work placing table, and a shutter mechanism for causing said pair of gas injecting heads to separate from each other and to abut against each other.

2. A die bonding apparatus claimed in claim 1 wherein the shape of said opening is similar to the contour of said solder supplying mechanism or said die bonding head.

3. A die bonding apparatus claimed in claim 2 wherein said hold-down member is mounted on each of said pair of gas injecting heads, and further including an up-down mechanism for vertically moving said pair of gas injecting heads.

4. A die bonding apparatus claimed in claim 3 wherein said shutter mechanism and said up-down mechanism are driven in coordination with each other by a common power source.

5. A die bonding apparatus claimed in claim 1 wherein said hold-down member is mounted on each of said pair of gas injecting heads, and further including an up-down mechanism for vertically moving said pair of gas injecting heads.

6. A die bonding apparatus claimed in claim 5 wherein said shutter mechanism and said up-down mechanism are driven in coordination with each other by a common power source.

* * * * *